United States Patent [19]

Chou

[11] Patent Number: 5,738,166
[45] Date of Patent: Apr. 14, 1998

[54] HEAT EXCHANGER

[76] Inventor: Ching-Long Chou, 58, Ma Yuan West St., Taichung, Taiwan

[21] Appl. No.: 786,802

[22] Filed: Jan. 21, 1997

Related U.S. Application Data

[63] Continuation-in-part of Ser. No. 594,431, Jan. 31, 1996, abandoned.

[51] Int. Cl.$^6$ .................................................. F28D 15/02
[52] U.S. Cl. ........................... 165/104.21; 165/104.33; 165/122; 165/119
[58] Field of Search ................................. 165/119, 122, 165/104.21, 104.33; 29/890.032

[56] References Cited

U.S. PATENT DOCUMENTS

| | | | |
|---|---|---|---|
| 3,807,493 | 4/1974 | Stewart | 165/104.33 X |
| 4,180,127 | 12/1979 | Maxson | 165/104.21 X |
| 4,240,189 | 12/1980 | Namiki | 165/104.21 X |
| 4,333,520 | 6/1982 | Yanadori et al. | 165/122 X |
| 4,706,739 | 11/1987 | Noren | 165/122 X |
| 5,035,281 | 7/1991 | Nevenfeldt et al. | 165/104.33 X |
| 5,528,454 | 6/1996 | Niklos | 165/122 X |

*Primary Examiner*—Leonard R. Leo

[57] ABSTRACT

A heat exchanger has a main body coupling with a positioning plate. A condensing device, two filter plates and two fans are disposed in the main body. The main body has a peripheral base plate, a first air exhaust exit and a first fan opening. A blocking wall is disposed transversely in the main body below the first air exhaust exit. The positioning plate has a peripheral flange, a second air exhaust exit, and a second fan opening. The first and second fans are positioned on the first and second fan openings. The first and second filter plates are positioned on the first and second air exhaust exit. The condensing device is disposed in the main body slantwise. Two heat-insulated sponge pads seal two opposite sides of the condensing device.

1 Claim, 3 Drawing Sheets

HEAT EXCHANGER

The present invention is a continuation-in-part of application Ser. No. 08/594,431, filed Jan. 31, 1996, now abandoned.

BACKGROUND OF THE INVENTION

The present invention relates to a heat exchanger. More particularly, the present invention relates to a heat exchanger which has a condensing device disposed therein slantwise.

Most CNC (computer numerical control) devices should maintain the environmental temperatures at a predetermined range. The temperatures of CNC devices are often lowered by fans. However, the conventional fans cannot adjust the temperatures effectively. The temperatures of CNC devices may be increased significantly after a long period of usage. Thus the CNC devices may be overheated. Further, the fans cannot prevent dust and water vapor from entering the interior of the CNC devices.

SUMMARY OF THE INVENTION

An object of the invention is to provide a heat exchanger which can control the temperature of a device or a machine.

Accordingly, a heat exchanger comprises a hollow main body coupling with a positioning plate. A condensing device, two filter plates and two fans are disposed in the main body. The hollow main body has a peripheral base plate to be positioned in a predetermined position, a first air exhaust exit and a first fan opening are formed on the upper surface of the main body. A plurality of a first rivet holes are formed on the main body to be passed through with the corresponding rivets. The first air exhaust exit is below the first fan opening. A blocking wall is disposed transversely in the main body below the first air exhaust exit. The blocking wall and the condensing device divide the interior of the main body into an upper and a lower chambers. The positioning plate has a peripheral flange to be inserted in the main body, a plurality of a second rivet holes to receive the corresponding rivets, a second air exhaust exit, and a second fan opening below the second air exhaust exit. The first and second fans are positioned on the first fan opening and the second fan opening, respectively. The hot air in the device and the cold air in the outer environment are inhaled by the corresponding fans. The first and second filter plates are positioned on the first air exhaust exit and the second air exhaust exit, respectively. Each of the filter plates has a plurality of a third rivet holes to receive the corresponding rivets. The condensing device is disposed in the main body slantwise. The condensing device has an upper plate, a lower plate, a plurality of radiation fins disposed between the upper plate and the lower plate spacedly, and a windings cooling pipe passing through the radiation fins vertically. A vacuum ejector is connected to an end of the winding cooling pipe. The winding cooling pipe contains a cooling agent therein. A plurality of a first through holes are formed on the upper plate. A plurality of a second through holes are formed on the lower plate. Each of the radiation fins has a plurality of penetration holes to be passed through by the windings cooling pipe. Two heat-insulated sponge pads seal two opposite sides of the condensing device. The upper end of the condensing device leans on the main body just above the first air exhaust exit. The lower end of the condensing device leans on the positioning plate just below the second air exhaust exit. Thus the first air exhaust exit and the first fan opening are separated by the condensing device. The second fan opening and the second air exhaust exit are separated by the condensing device also. The first fan will inhale the hot air from the interior of the machine into the condensing device. The hot air will be cooled down by the condensing device. The second fan will inhale the cold air from the outer environment.

DETAILED DESCRIPTION OF THE INVENTION

Figure 1:
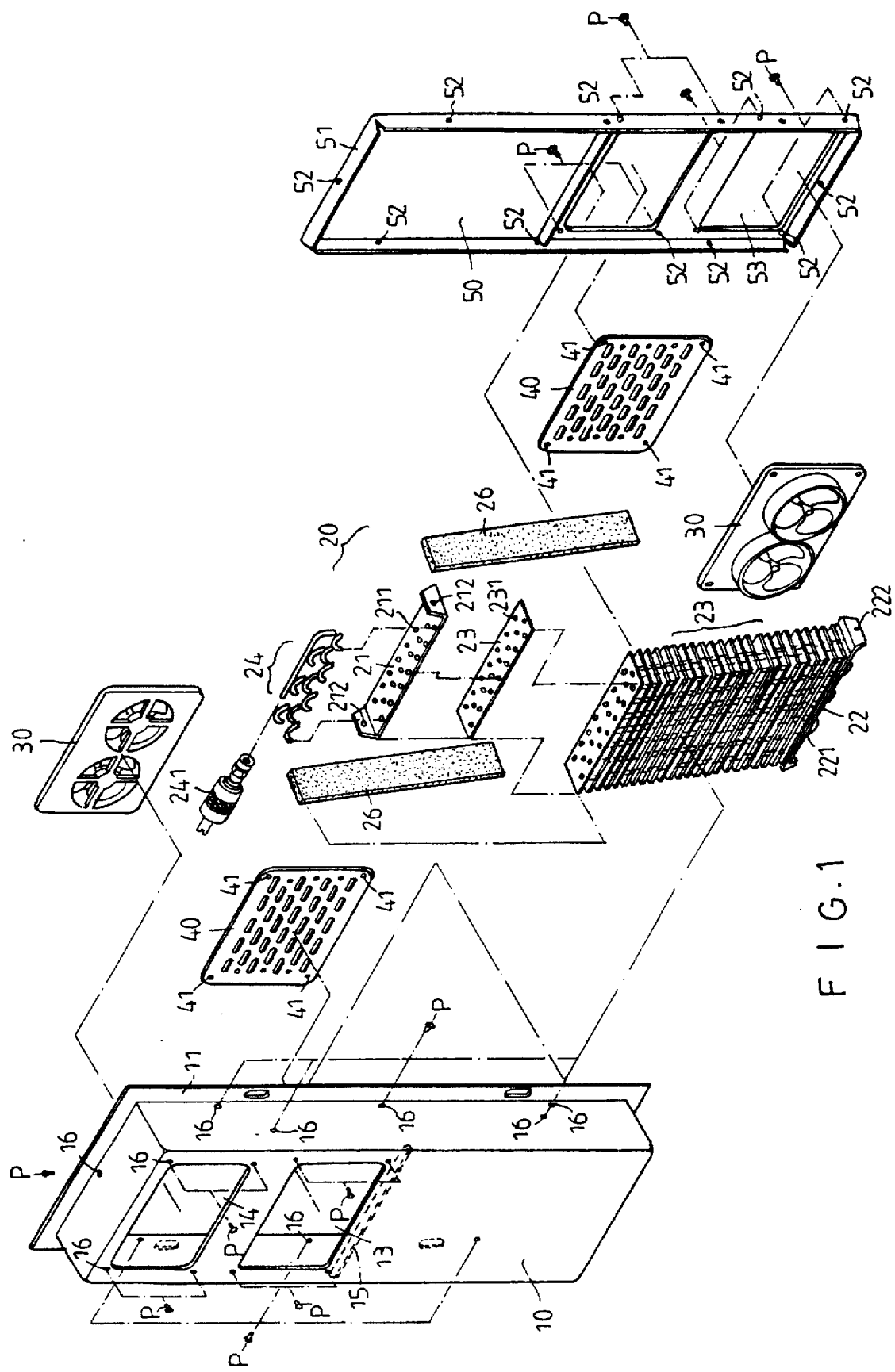
FIG. 1 is a perspective exploded view of a heat exchanger of a preferred embodiment in accordance with the invention.
Figure 2:
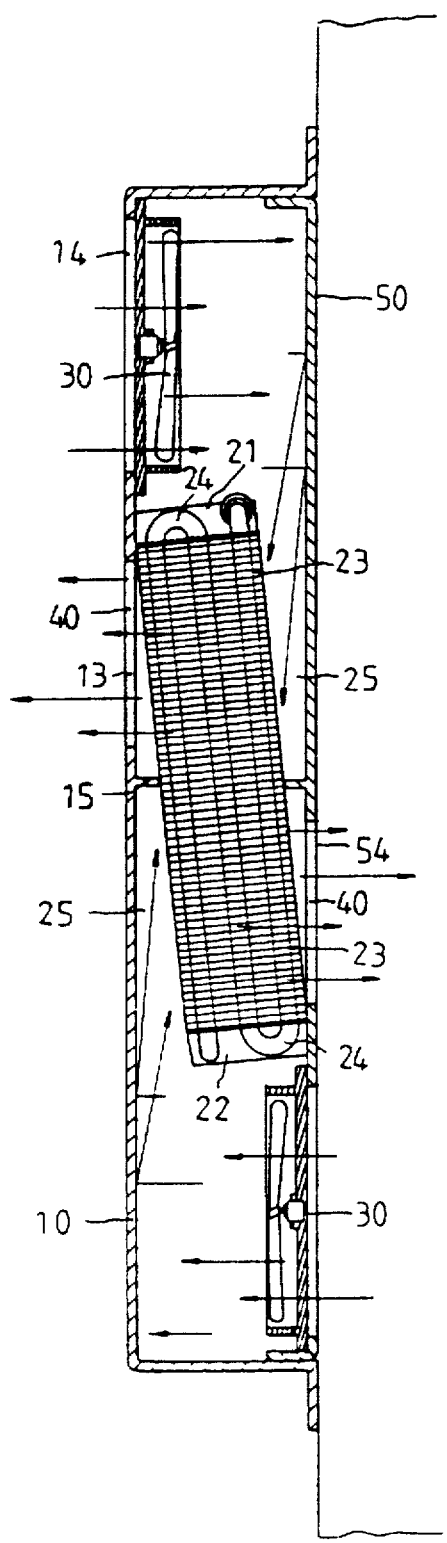
FIG. 2 is a cross-sectional view of a heat exchanger of a preferred embodiment.
Figure 3:
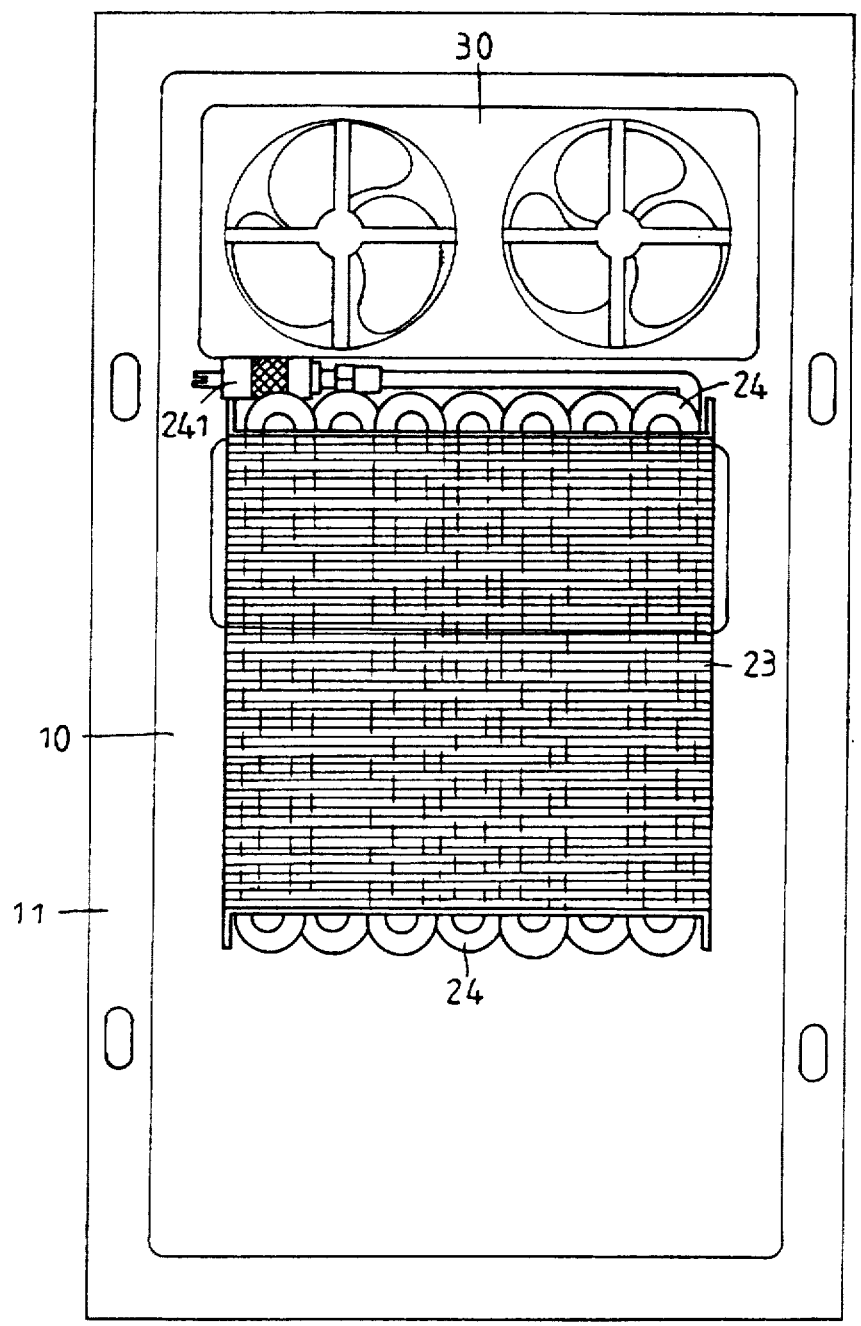
FIG. 3 is an elevational view of a heat exchanger of a preferred embodiment.

Referring to FIGS. 1 to 3, a heat exchanger has a hollow main body 10 coupling with a positioning plate 50. A condensing device 20, two filter plates 40 and two fans 30 are disposed in the main body 10. The hollow main body 10 has a peripheral base plate It to be positioned in a predetermined position, a first air exhaust exit 13 and a first fan opening 14 are formed on the upper surface of the main body 10. A plurality of a first rivet holes 16 are formed on the main body 10 to be passed through with the corresponding rivets P. The first air exhaust exit 13 is below the first fan opening 14. A blocking wall 15 is disposed transversely in the main body 10 below the first air exhaust exit 13. The blocking wall 15 and the condensing device 20 divide the interior of the main body to into an upper and a lower chambers 25. The positioning plate 50 has a peripheral flange 51 to be inserted in the main body 10, a plurality of a second rivet holes 52 to receive the corresponding rivets P, a second air exhaust exit 54, and a second fan opening 53 below the second air exhaust exit 54. The first and second fans 30 are positioned on the first fan opening 14 and the second fan opening 53, respectively. The hot air in the device and the cold air in the outer environment are inhaled by the corresponding fans 30. The first and second filter plates 40 are positioned on the first air exhaust exit 13 and the second air exhaust exit 54, respectively. Each of the filter plates 40 has a plurality of a third rivet holes 41 to receive the corresponding rivets P. The condensing device 20 is disposed in the main body 10 slantwise. The condensing device 20 has an upper plate 21, a lower plate 22, a plurality of radiation fins 23 disposed between the upper plate 21 and the lower plate 22 spacedly, and a windings cooling pipe 24 passing through the radiation fins 23 vertically. A vacuum ejector 241 is connected to an end of the winded cooling pipe 24. The winding cooling pipe 24 contains a cooling agent therein. A plurality of a first through holes 211 and two round holes 212 are formed on the upper plate 21. A plurality of a second through holes 221 and two round holes 222 are formed on the lower plate 22. Each of the radiation fins 23 has a plurality of penetration holes 231 to be passed through by the winding cooling pipe 24. Two heat-insulated sponge pads 26 and silicone adhesives seal two opposite sides of the condensing device 20. The upper end of the condensing device 20 leans on the main body 10 just above the first air exhaust exit 13. The lower end of the condensing device 20 leans on the positioning plate 50 just below the second air exhaust exit 54. Thus the first air exhaust exit 13 and the first fan opening 14 are separated by the condensing device 20. The second fan opening 53 and the second air exhaust exit 54 are separated by the condensing device 20 also. The first fan 30 will inhale the hot air from the interior of the machine into the condensing device 20. The hot air will be cooled down by the condensing device 20. The second fan 30 will inhale the cold air from the outer environment. The heat exchanger can prevent dust and water vapor from entering the interior of the machine.

The invention is not limited to the above embodiment but various modification thereof may be made. Further, various changes in form and detail may be made without departing from the scope of the invention.

I claim:

1. A heat exchanger comprising:

a hollow main body coupling with a positioning plate to define an interior of said hollow main body;

said hollow main body having a peripheral base plate, a first air exhaust exit and a first fan opening formed on an upper surface of said main body;

said first air exhaust exit disposed below said first fan opening;

a blocking wall disposed transversely in said main body below said first air exhaust exit;

said blocking wall and a condensing device dividing said interior of said main body into an upper and a lower chamber;

said positioning plate having a peripheral flange to be inserted in said main body; a second air exhaust exit, and a second fan opening disposed below said second air exhaust exit;

first and second fans positioned on said first fan opening and said second fan opening, respectively;

first and second filter plates positioned on said first air exhaust exit and said second air exhaust exit, respectively;

said condensing device disposed in said main body slantwise, upper end of said condensing device leaning on said main body just above said first air exhaust exit, a lower end of said condensing device leaning on said positioning plate just below said second air exhaust exit;

said condensing device having an upper plate, a lower plate, a plurality of radiation fins disposed between said upper plate and said lower plate spacedly, and a winding cooling pipe passing through said radiation fins vertically;

a vacuum ejector connected to an end of said winding cooling pipe;

a plurality of first through holes formed on said upper plate;

a plurality of second through holes formed on said lower plate;

each of said radiation fins having a plurality of penetration holes to be passed through by said winding cooling pipe; and two heat-insulated sponge pads sealing two opposite sides of said condensing device.

* * * * *